(12) United States Patent
Davis et al.

(10) Patent No.: US 9,828,821 B2
(45) Date of Patent: Nov. 28, 2017

(54) TESTING A SOLENOID OF A DIRECTIONAL CONTROL VALVE

(75) Inventors: Julian Davis, Bristol (GB); Martin Stokes, Gwent (GB)

(73) Assignee: GE Oil & Gas UK Limited, Nailsea (GB)

( * ) Notice: Subject to any disclaimer, the term of this patent is extended or adjusted under 35 U.S.C. 154(b) by 475 days.

(21) Appl. No.: 13/399,388

(22) Filed: Feb. 17, 2012

(65) Prior Publication Data

US 2012/0212230 A1    Aug. 23, 2012

(30) Foreign Application Priority Data

Feb. 18, 2011    (EP) .................................... 11154975

(51) Int. Cl.

| | |
|---|---|
| *G01R 31/06* | (2006.01) |
| *E21B 33/035* | (2006.01) |
| *E21B 34/06* | (2006.01) |
| *E21B 41/00* | (2006.01) |
| *H01F 7/18* | (2006.01) |
| *F16K 37/00* | (2006.01) |

(52) U.S. Cl.
CPC ........ *E21B 33/0355* (2013.01); *E21B 34/066* (2013.01); *E21B 41/0007* (2013.01); *F16K 37/0083* (2013.01); *H01F 7/1844* (2013.01); *G01R 31/06* (2013.01); *H01F 2007/1888* (2013.01)

(58) Field of Classification Search
CPC ..................................................... G01R 31/06
See application file for complete search history.

(56) References Cited

U.S. PATENT DOCUMENTS

| | | | |
|---|---|---|---|
| 4,870,364 A | 9/1989 | Trox et al. | |
| 5,153,522 A | 10/1992 | Sano | |
| 5,241,218 A | 8/1993 | Page | |
| 5,245,501 A | 9/1993 | Locher et al. | |
| 5,796,201 A | 8/1998 | Kamitani et al. | |
| 6,211,665 B1 | 4/2001 | Ahrendt et al. | |
| 6,326,898 B1 | 12/2001 | O'Leyar et al. | |
| 6,577,133 B1 * | 6/2003 | Barron | 324/415 |
| 6,917,203 B1 | 7/2005 | Perotti et al. | |
| 7,483,253 B2 * | 1/2009 | Schumacher | 361/160 |
| 7,905,373 B2 * | 3/2011 | Beavis et al. | 222/1 |
| 8,542,006 B2 * | 9/2013 | Liu | 324/207.16 |

(Continued)

FOREIGN PATENT DOCUMENTS

| | | |
|---|---|---|
| DE | 3624231 A | 1/1988 |
| EP | 2053289 A2 | 4/2009 |
| GB | 2110373 A | 6/1983 |

OTHER PUBLICATIONS

EP Search Rport issued in priority EP Application 11154975.4 Date of Search Report Aug. 18, 2017 (7 Pages).

*Primary Examiner* — Jermele M Hollington
*Assistant Examiner* — Feba Pothen
(74) *Attorney, Agent, or Firm* — GE Global Patent Operation

(57) ABSTRACT

A method of testing a solenoid of a directional control valve in a subsea hydrocarbon production system, the solenoid having a coil and an armature for operating the valve and the coil being energized by a drive voltage across it, the method comprises removing or reducing the drive voltage and sensing current through the coil to produce an indication of movement of the armature.

15 Claims, 3 Drawing Sheets

(56) References Cited

U.S. PATENT DOCUMENTS

| | | |
|---|---|---|
| 2006/0285265 A1 | 12/2006 | Ganev et al. |
| 2009/0213520 A1* | 8/2009 | Bedingfield .......... H01F 7/1805 361/154 |
| 2010/0148755 A1 | 6/2010 | Liu |
| 2011/0094589 A1* | 4/2011 | Jacob et al. ...................... 137/1 |

* cited by examiner

TESTING A SOLENOID OF A DIRECTIONAL CONTROL VALVE

BACKGROUND OF THE INVENTION

Field of the Invention

Embodiments of the present invention relate to testing a solenoid of a directional control valve in a subsea hydrocarbon production control system.

Description of Prior Art

Continuously energized electro-hydraulic, solenoid operated directional control valves (DCVs) are often used in subsea well electro-hydraulic production control systems in safety related or safety critical applications where loss of electrical power, or the detection of a dangerous condition, results in the de-energizing of a coil of the DCV solenoid and the resultant closure, and hydraulic pressure venting, of the hydraulic supply. Under these conditions, it is therefore critical that an armature of the DCV solenoid not stick in the open position after the solenoid coil is de-energized. However, since such continuously energized valves are often energized for extended periods of time, it cannot be guaranteed that the armature of a DCV solenoid will move to close the valve when demanded to do so by de-energizing the solenoid coil.

BRIEF SUMMARY OF THE INVENTION

In accordance with an embodiment of the present invention, there is provided a method of testing a solenoid of a directional control valve in a subsea hydrocarbon production system, the solenoid having a coil and an armature for operating the valve and the coil being energized by a drive voltage across it, the method comprises removing or reducing the drive voltage, and sensing current through the coil to produce an indication of movement of the armature.

In accordance with another embodiment of the present invention, there is provided a method of testing a solenoid of a directional control valve in a subsea hydrocarbon production system, the solenoid having a coil and an armature for operating the valve and the coil being energized by a drive voltage across it, the method comprises removing or reducing the drive voltage, and sensing current through the coil to produce an indication of movement of the armature, wherein the drive voltage is reduced by pulse width modulation of voltage applied by drive circuitry for the solenoid, the indication is produced by detecting a perturbation of the current due to a change in the inductance of the coil due to movement of the armature and if the drive voltage is removed or reduced but no such indication is produced before it reaches zero, the voltage is increased to the drive voltage and then reduced again.

In accordance with another embodiment of the present invention, there is provided a subsea hydrocarbon production control system, the system comprises a directional control valve comprising a solenoid having a coil and an armature for operating the valve, a mechanism for applying a drive voltage across the coil for moving the armature, and a testing module, wherein the testing module comprises a mechanism for removing or reducing the drive voltage and a mechanism for sensing current through the coil to produce an indication of movement of the armature.

BRIEF DESCRIPTION OF THE DRAWINGS

Embodiments of the invention will now be described with reference to the accompanying drawings, in which.

DETAILED DESCRIPTION OF THE INVENTION

According to an embodiment of the present invention, there is provided a method of testing a solenoid of a directional control valve in a subsea hydrocarbon production system, wherein the solenoid has a coil and an armature for operating the valve and the coil being energized by a drive voltage across it, the method comprising removing or reducing the drive voltage and sensing current through the coil to produce an indication of movement of the armature.

According to another embodiment of the present invention, there is provided a subsea hydrocarbon production control system, comprising a directional control valve having a solenoid which has a coil and an armature for operating the valve, the system including means for applying a drive voltage across the coil for moving the armature and testing means which comprise means for removing or reducing the drive voltage and means for sensing current through the coil to produce an indication of movement of the armature.

The drive voltage could be reduced by pulse width modulation of voltage applied by drive circuitry for the solenoid. The indication may be produced by detecting a perturbation of the current due to a change in the inductance of the coil due to movement of the armature. In one embodiment, if the drive voltage is removed or reduced but no such indication is produced before it reaches zero, the voltage is increased to the drive voltage and then reduced again.

In one embodiment, the drive voltage is removed or reduced by processor means in a subsea electronics module of a subsea control module. In another embodiment, the voltage is returned to the drive voltage in response to the indication.

Figure 1:
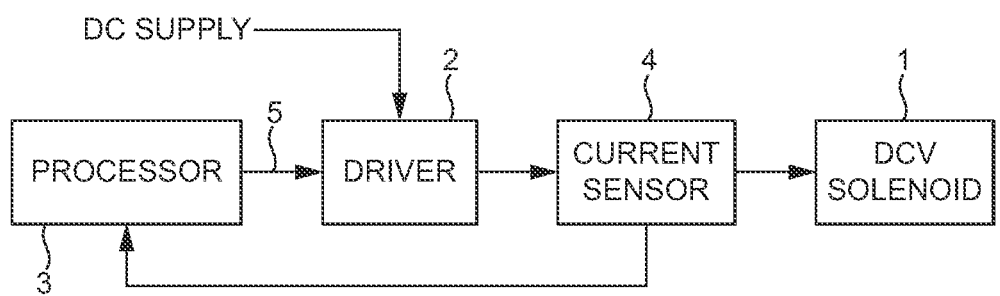
FIG. 1 is a block diagram showing items for energizing the coil of a DCV solenoid in accordance with an embodiment of the present invention.

FIG. 1 illustrates an arrangement for the operation and control of a DCV in the production control system of a subsea hydrocarbon well. The well control system may include a number of processors, typically housed in a subsea electronics module (SEM), at least one of which will control all of the DCVs on the well, which are housed, along with the SEM, in a subsea control module (SCM) mounted on a well tree. Typically, a DCV is operated by energizing the coil of its solenoid 1 from a DC power supply switched on by a power driver 2 from a control signal (on/off) from a processor 3. In embodiments of the present invention, current sensing circuitry in the form of a current sensor 4 detects the current in the coil of the DCV solenoid and modified software in the processor 3 controls the power driver 2 by pulse width modulation (PWM) to provide a variable output to the solenoid coil. The power driver 2 is typically a simple transistor, but instead of simply turning it off and on to operate the solenoid, the processor produces a control on a line 5 to provide the variable voltage required for the embodiment of this invention.

According to an embodiment of the present invention, a DCV solenoid is tested at regular intervals, during extended periods of continuous activation of the DCV solenoid drive circuit, by performing partial closure (but not full closure) of the DCV by removing or gradually reducing the DCV solenoid drive current for a short interval, sufficiently long enough for the DCV solenoid armature to start to move toward the closed position. During this DCV solenoid coil current removal or reduction interval, the solenoid current is monitored, to detect the perturbation (a distinct 'kick' in the current flow) resulting from the change of inductance of the solenoid coil due to movement of the armature of the solenoid. Lack of detection of the perturbation indicates that the DCV solenoid armature has stuck, whereby an alarm is sent to the well operator.

Figure 2:
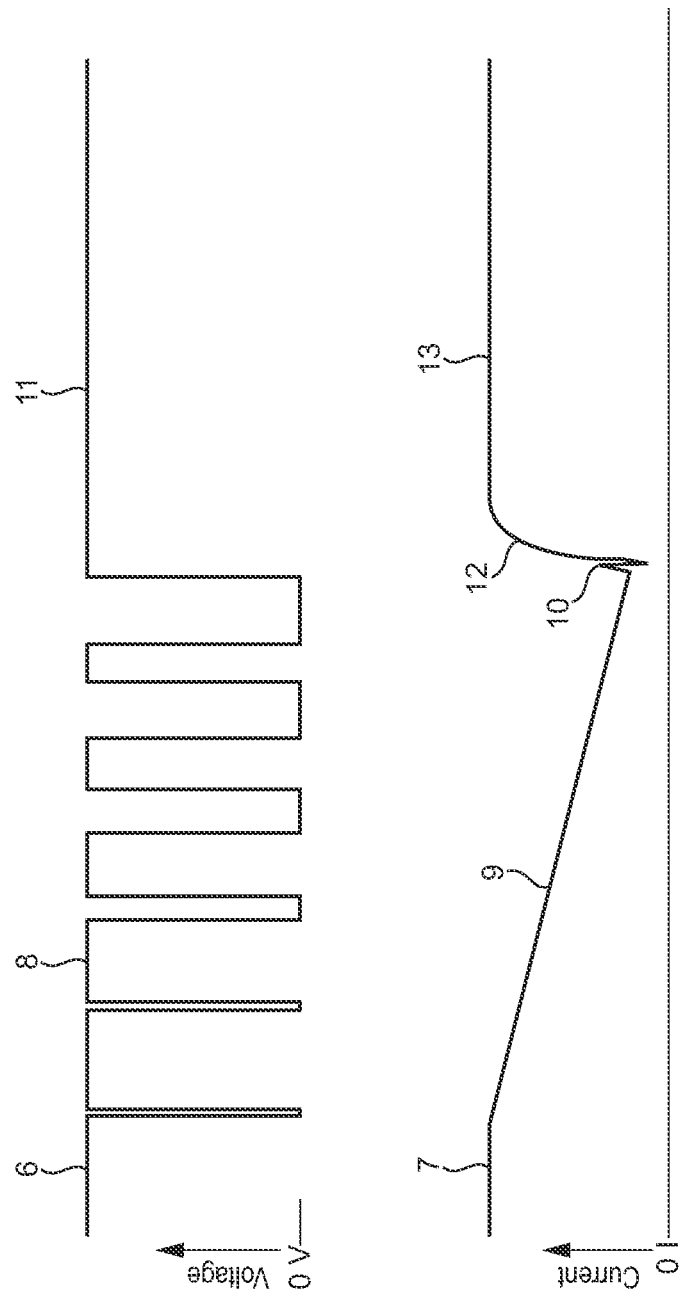
FIG. 2 shows voltage and current waveforms occurring in operation of an embodiment of the present invention.

FIG. 2 shows how the current in the coil of DCV solenoid (lower graph) is varied by changing the applied voltage (upper graph) by PWM under the control of the modified software in the processor 3. The mode of operation, controlled by the software in the processor 3, is as follows.

The energized coil of DCV solenoid 1 has a full operating voltage 6 applied, resulting in an operating current 7 determined by the resistance of the solenoid coil. To test the solenoid to check that its armature is not stuck, the processor 3 produces a varying voltage 8 by PWM to the power driver 2, resulting in a reduction of the mean voltage applied to the coil of the DCV solenoid 1 and thus a reduction in the mean current 9. When the current has fallen to the point where the solenoid armature begins to move towards its return state, the resultant perturbation 10 in the current (due to a change in the inductance of the solenoid coil) is sensed by the current sensor 4 and an indication of this is sent to the processor 3, which is programmed to immediately return the supply voltage to the full supply 11. The current in the solenoid coil then rises as shown by reference 12, exponentially, due to the inductance of the coil of the solenoid, to its normal operating state 13 to prevent any further movement of the solenoid armature and to return it to its fully operated state. The process is implemented rapidly so that the movement of the armature DCV solenoid is small and the DCV is not closed and thus there is substantially no effect on the well operation. The processor 3 performs the above operation as often as the well operator requires. For example, if the current in the solenoid falls to zero without a current perturbation, the power supply is immediately reverted to full and the process repeated a number of times. A continual lack of current perturbation will finally result in the processor sending an alarm to the well operator via the well to surface communication system.

Instead of gradually reducing the voltage across the solenoid coil, the processor 3 could cause removal of it for a short time interval, say 10 milliseconds, insufficient to close the DCV, whereby the current collapses very quickly to a point where the armature starts to move again. Because the armature moves, the inductance of the solenoid will change and because the inductance changes the current briefly goes up again to produce a perturbation like perturbation 10 which is detected by sensor 4.

Figure 3:
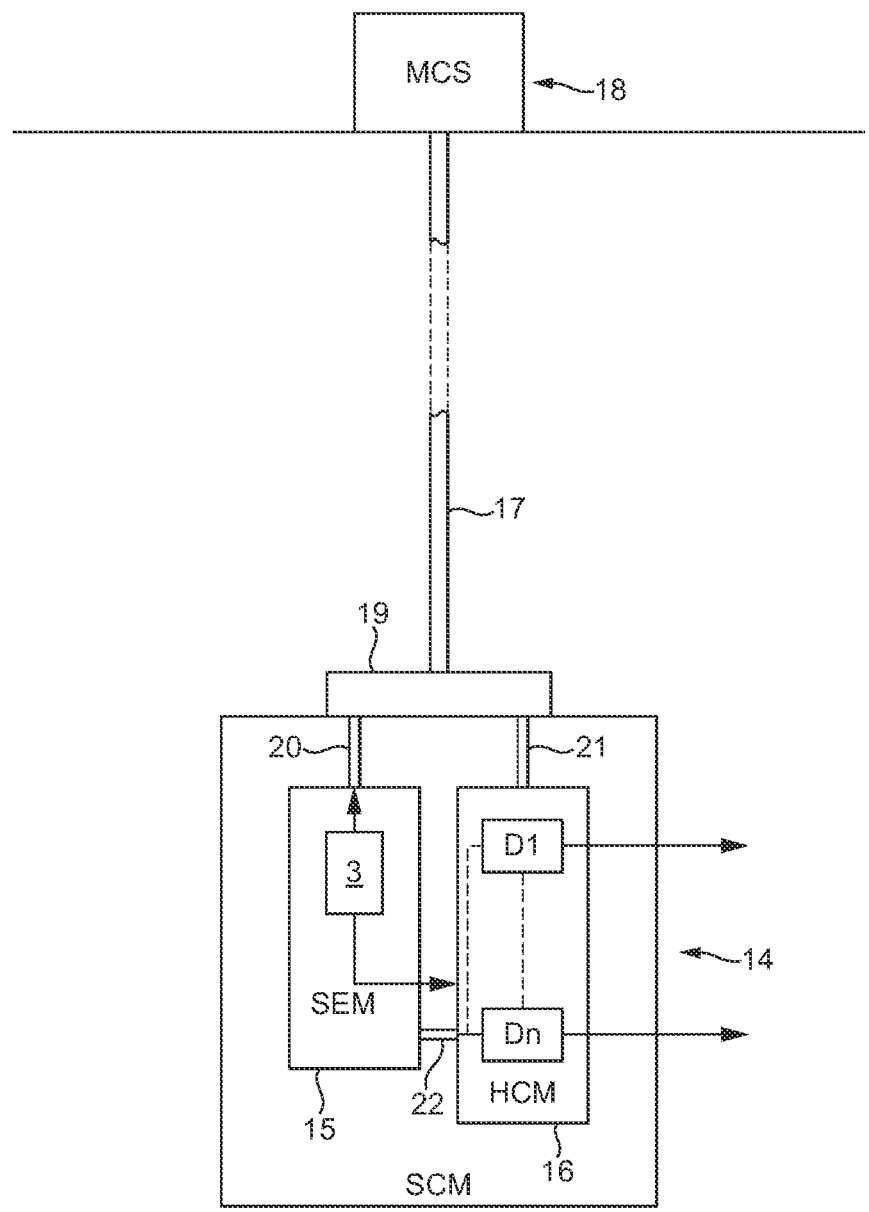
FIG. 3 is a schematic view of a subsea hydrocarbon production control system incorporating an embodiment of the present invention.

Referring to FIG. 3, this shows schematically a subsea hydrocarbon production control system incorporating an embodiment of the present invention. In a subsea control module (SCM) 14 there is a subsea electronics module (SEM) 15 and a hydraulic control module (HCM) 16. The SCM 14 is fed by an umbilical 17 from a topside master control station (MCS) 18, e.g. at a surface platform, with electric power, control signals and hydraulic power. The control signals are processed by the SEM 15 which then controls solenoid operated, hydraulic directional control valves (DCVs) D1-Dn in the HCM 16 which in turn operate a multiplicity of hydraulic devices such as actuators for controlling a subsea hydrocarbon production well. The subsea control system is located at a well tree, the SCM 14 being connected to the umbilical 17 via a distribution unit 19 which provides the electric power and control signals to the SEM 15 via a cable 20 and hydraulic power to the HCM 16 via a feed 21. The SEM 15 controls the DCVs D1-Dn in the HCM 16 via a cable 22.

In accordance with an embodiment of the present invention, the SEM 15 includes a processor 3 for use in testing a DCV whose coil is continuously energized, in a manner as described above, any such alarm as described above being sent from processor 3 to the MCS 18. For clarity, current sensor(s) 4 and driver(s) 2 have been omitted from FIG. 3.

Although the application described above is 'closed loop' it is possible to implement embodiments of the present invention by 'open loop' control when desired via the well operator from a control station.

Advantages of using the embodiments of the present invention include enhanced protection against the occurrence of a failure when a continuously energized DCV is demanded to close and reduces the likelihood of undisclosed failures.

What is claimed is:

1. A method of testing a solenoid of a directional control valve in a subsea hydrocarbon production system, the solenoid having a coil and an armature for operating the valve and the coil being energized by a drive voltage across it, the method comprising:
reducing the drive voltage to a voltage greater than zero, wherein the drive voltage is reduced by pulse width modulation of voltage applied by drive circuitry for the solenoid, and wherein the pulse width modulation comprises providing a train of square wave pulses, wherein each square wave pulse has a magnitude of full supply voltage, and wherein each pulse in the train of square wave pulses is of a progressively shorter duration than a previous pulse for each of the square wave pulses; and
sensing current through the coil to produce an indication of movement of the armature to test the solenoid;
wherein the indication is produced by detecting a perturbation of the current due to a change in the inductance of said coil due to movement of the armature.

2. The method according to claim 1, wherein the drive voltage is reduced by a processor in a subsea electronics module of a subsea control module.

3. The method according to claim 1, wherein if the drive voltage is reduced but the indication is not produced before the drive voltage reaches zero, the voltage is increased to the drive voltage and then reduced again.

4. The method according to claim 1, wherein voltage is returned to the drive voltage in response to the indication.

5. A method of testing a solenoid of a directional control valve in a subsea hydrocarbon production system, the solenoid having a coil and an armature for operating the valve and the coil being energized by a drive voltage across it, the method comprising:
reducing the drive voltage to a voltage greater than zero, wherein the drive voltage is reduced by pulse width modulation of voltage applied by drive circuitry for the solenoid, and wherein the pulse width modulation comprises providing a train of square wave pulses, wherein each square wave pulse has a magnitude of full supply voltage, and wherein each pulse in the train of square wave pulses is of a progressively shorter duration than a previous pulse for each of the square wave pulses; and sensing current through the coil to produce an indication of movement of the armature to test the solenoid, wherein the indication is produced by detecting a perturbation of the current due to a change in the inductance of the coil due to movement of the armature and if the drive voltage is reduced but no such indication is produced before it reaches zero, the voltage is increased to the drive voltage and then reduced again.

6. The method according to claim 5, wherein the drive voltage is reduced by a processor in a subsea electronics module of a subsea control module.

7. The method according to claim 5, wherein voltage is returned to the drive voltage in response to the indication.

8. A subsea hydrocarbon production control system, the system comprising:
- a directional control valve comprising a solenoid having a coil and an armature for operating the valve;
- a mechanism for applying a drive voltage across the coil for moving the armature; and
- a testing module, wherein the testing module comprises a mechanism for reducing the drive voltage to a voltage greater than zero, a sensing mechanism for sensing current through the coil to produce an indication of movement of the armature to test the solenoid, wherein the drive voltage is reduced by pulse width modulation of voltage applied by drive circuitry for the solenoid, and wherein the pulse width modulation comprises providing a train of square wave pulses, wherein each square wave pulse has a magnitude of full supply voltage, and wherein each pulse in the train of square wave pulses is of a progressively shorter duration than a previous pulse for each of the square wave pulses;
wherein the sensing mechanism comprises a mechanism for producing the indication by detecting a perturbation of the current due to a change in the inductance of the coil due to movement of the armature.

9. The system according to claim 8, wherein the testing module is adapted to increase the voltage of the drive voltage and then reduce the drive voltage again if the indication is not produced before the drive voltage reaches zero.

10. The system according to claim 8, wherein the testing module is adapted to return voltage to the drive voltage in response to the indication.

11. The system according to claim 8, wherein the mechanism for reducing the drive voltage comprises a processor in a subsea electronics module of a subsea control module.

12. The method of claim 1, further comprising:
- monitoring current through the solenoid coil to detect a spike in the current flow when the drive voltage of the solenoid coil is being reduced; and
- returning the drive voltage to full supply voltage upon detection of the spike in the current flow.

13. The method according to claim 12, wherein the spike in the current flow is produced when the current through the solenoid coil reduces to a level at which the armature begins to move towards its return state.

14. The system of claim 8, further comprising:
- monitoring current through the solenoid coil to detect a spike in the current flow when the drive voltage of the solenoid coil is being reduced; and
- returning the drive voltage to full supply voltage upon detection of the spike in the current flow.

15. The system of claim 14, wherein the spike in the current flow is produced when the current through the solenoid coil reduces to a level at which the armature begins to move towards its return state.

* * * * *